United States Patent
Karda et al.

(10) Patent No.: US 9,577,092 B2
(45) Date of Patent: Feb. 21, 2017

(54) APPARATUSES HAVING A VERTICAL MEMORY CELL

(71) Applicant: Micron Technology, Inc., Boise, ID (US)

(72) Inventors: Kamal M. Karda, Boise, ID (US); Rajesh N. Gupta, Karnataka (IN); Srinivas Pulugurtha, Boise, ID (US); Chandra V. Mouli, Boise, ID (US); Wolfgang Mueller, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 14/517,261

(22) Filed: Oct. 17, 2014

(65) Prior Publication Data
US 2015/0054063 A1 Feb. 26, 2015

(51) Int. Cl.
| H01L 29/78 | (2006.01) |
| G11C 11/40 | (2006.01) |
| H01L 27/02 | (2006.01) |
| H01L 27/105 | (2006.01) |
| H01L 29/66 | (2006.01) |
| H01L 27/108 | (2006.01) |

(52) U.S. Cl.
CPC ........... *H01L 29/7827* (2013.01); *G11C 11/40* (2013.01); *H01L 27/0207* (2013.01); *H01L 27/1052* (2013.01); *H01L 27/10873* (2013.01); *H01L 27/10885* (2013.01); *H01L 29/66666* (2013.01); *H01L 27/10855* (2013.01); *H01L 27/10891* (2013.01)

(58) Field of Classification Search
CPC ........... H01L 29/7827; H01L 27/02072; H01L 27/10855; H01L 27/10873; H01L 27/10891; H01L 27/1052; H01L 29/66666; G11C 11/40
See application file for complete search history.

(56) References Cited

U.S. PATENT DOCUMENTS

| 5,087,581 A | 2/1992 | Rodder |
| 5,382,816 A | 1/1995 | Mitsui |
| 6,355,520 B1 | 3/2002 | Park et al. |

(Continued)

OTHER PUBLICATIONS

Date et al., Suppression of the Floating-Body Effect Using SiGe Layers in Vertical Surrounding-Gate MOSFETSs, IEEE Transactions on Electron Devices, vol. 48, No. 12, Dec. 2001, pp. 2684-2689.

(Continued)

*Primary Examiner* — Long Pham
(74) *Attorney, Agent, or Firm* — TraskBritt

(57) ABSTRACT

Methods, apparatuses, and systems for providing a body connection to a vertical access device. The vertical access device may include a digit line extending along a substrate to a digit line contact pillar, a body connection line extending along the substrate to a body connection line contact pillar, a body region disposed on the body connection line, an electrode disposed on the body region, and a word line extending to form a gate to the body region. A method for operation includes applying a first voltage to the body connection line, and applying a second voltage to the word line to cause a conductive channel to form through the body region. A memory cell array may include a plurality of vertical access devices.

22 Claims, 7 Drawing Sheets

(56) References Cited

U.S. PATENT DOCUMENTS

| | | | |
|---|---|---|---|
| 6,441,422 | B1 | 8/2002 | Mandelman et al. |
| 7,141,845 | B2 * | 11/2006 | Manger ............. H01L 27/10841 |
| | | | 257/301 |
| 7,378,702 | B2 | 5/2008 | Lee |
| 7,387,931 | B2 | 6/2008 | Seo et al. |
| 7,489,002 | B2 | 2/2009 | Forbes et al. |
| 7,611,931 | B2 | 11/2009 | Cheng et al. |
| 7,759,188 | B2 | 7/2010 | Cheng et al. |
| 2007/0045697 | A1 | 3/2007 | Cheng et al. |
| 2008/0173920 | A1 | 7/2008 | Juengiing |
| 2008/0237708 | A1 | 10/2008 | Mandelman et al. |
| 2010/0224924 | A1 | 9/2010 | Ellis et al. |
| 2012/0080725 | A1 | 4/2012 | Manos et al. |
| 2013/0095645 | A1 | 4/2013 | Forbes |
| 2014/0247674 | A1 | 9/2014 | Karda et al. |

OTHER PUBLICATIONS

Mueller et al., U.S. Appl. No. 14/075,480 entitled Semiconductor Devices Including Vertical Memory Cells and Methods of Forming Same, filed Nov. 8, 2013.

* cited by examiner

APPARATUSES HAVING A VERTICAL MEMORY CELL

CROSS-REFERENCE TO RELATED APPLICATION

This application is a continuation of U.S. patent application Ser. No. 13/782,792, filed Mar. 1, 2013, now U.S. Pat. No. 8,878,271, issued Nov. 4, 2014, the disclosure of which is hereby incorporated herein in its entirety by this reference.

TECHNICAL FIELD

The present disclosure relates to vertical memory cells and memory arrays, and more particularly to vertical access devices having a body connection line.

BACKGROUND

The use of an access device with a storage element in memory cells is well known in the art. Examples of memory devices that utilize access devices include dynamic random-access memory (DRAM), resistive random-access memory (RRAM), magnetoresistive random-access memory (MRAM), and phase-change random-access memory (PRAM).

An ever-increasing demand for higher-density memory cell arrays has lead to the development of vertical memory cell devices. Vertical memory cell devices may enable higher-density cell arrays by offsetting an access device vertically from a storage element, thereby requiring less horizontal area than if the access device were offset horizontally from the storage element.

FIG. 1A is a simplified plan view of a portion of a conventional memory cell array 100. The conventional memory cell array 100 includes a plurality of vertical memory cells 101, a plurality of digit lines 104 (in dashed lines to show they are buried), and a plurality of word lines 114 (in dashed lines to show they are buried). The vertical memory cells 101 are arranged in rows (coupled to a common digit line 104) and columns (coupled to a common word line 114). Individual vertical memory cells 101 are located at a cross-point of a digit line 104 and a word line 114.

FIG. 1B is a simplified cross-sectional view of a vertical memory cell 101 taken along line 1B of FIG. 1A. The vertical memory cell 101 may be formed on a substrate 102. The vertical memory cell 101 includes a digit line 104, a body region 106 disposed on the digit line 104, an electrode 108 disposed on the body region 106, a word line 114 proximate to the body region 106, and a storage element 110 (e.g., a capacitor) disposed on the electrode 108. The vertical memory cell 101 also includes a dielectric material 112 on the substrate 102, and surrounding the vertical memory cell 101. The dielectric material 112 insulates the body region 106 from the word line 114.

A portion of the dielectric material 112 located between the body region 106 and the word line 114 is configured as a gate dielectric, and may comprise a dielectric with properties that are different from those of the remainder of the dielectric material 112.

The vertical memory cell 101 is configured to establish electrical connection and isolation between the digit line 104 and the storage element 110. In other words, the digit line 104, the body region 106, and the electrode 108 form an access transistor, with the word line 114 acting as its gate. In operation, a first voltage is applied to the word line 114, which may attract charge carriers to a segment of the body region 106 that is proximate to the word line 114. As a result, a conductive channel 116 (in dashed lines to show intermittent presence) may be formed through the body region 106 between the digit line 104 and the electrode 108. The conductive channel 116 enables the digit line 104 to access the storage element 110 for read or write operations.

If the first voltage is removed from the word line 114, the conductive channel 116 may be cut off, electrically isolating the storage element 110 from the digit line 104. As a result, by selectively applying the first voltage to the word line 114, electrical connection and isolation between the digit line 104 and the storage element 110 may be established. In addition, different combinations of voltages may be applied to the word line 114 and the digit line 104 to select a particular vertical memory cell 101 from the conventional memory cell array 100 for a read or write operation.

Although the vertical memory cell 101 may successfully establish electrical connection and isolation between the digit line 104 and the storage element 110, the body region 106 is a floating body. Consequently, the vertical memory cell 101 suffers from floating body effects, which may result in degraded charge retention time in the case of DRAM devices, and power distribution problems in the conventional memory cell array 100.

DETAILED DESCRIPTION

Figure 1A:
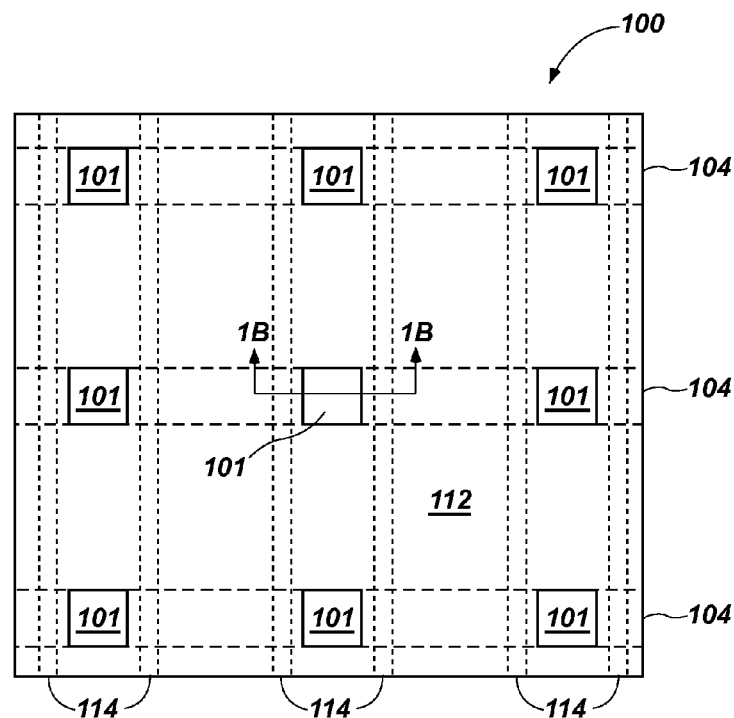
FIG. 1A is a simplified plan view of a portion of a conventional memory cell array.

In the following detailed description, reference is made to the accompanying drawings that form a part hereof, and in which is shown by way of illustration specific embodiments in which the present disclosure may be practiced. These embodiments are described in sufficient detail to enable those of ordinary skill in the art to make, use, or otherwise practice the present disclosure. It should be understood, however, that the detailed description and the specific examples, while indicating examples of embodiments of the present disclosure, are given by way of illustration only and not by way of limitation. From this disclosure, various substitutions, modifications, additions, rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular method, device, or system, but are merely idealized representations that are employed to describe various embodiments of the present disclosure. Accordingly, the dimensions of how various features are depicted may be arbitrarily expanded or reduced for clarity. In addition, some of the drawings may be simplified for clarity. Thus, the drawings may not depict all of the components of a given apparatus (e.g., device, system, etc.) or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

In addition, the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

In addition, it is noted that some embodiments may be described in terms of a process that is depicted as a flowchart, a flow diagram, a structure diagram, or a block diagram. Although a flowchart may describe operational acts as a sequential process, many of these operational acts can be performed in another sequence, in parallel, or substantially concurrently. In addition, the order of the operational acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on a computer-readable medium. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to a first element and a second element does not mean that only two elements may be employed there or that the first element must precede the second element in some manner. Also, unless stated otherwise a set of elements may comprise one or more elements.

Figure 1B:
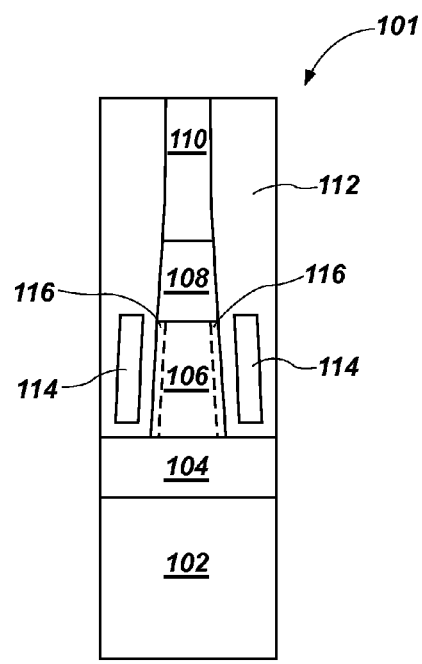
FIG. 1B is a simplified cross-sectional view of a conventional vertical memory cell taken along line 1B of FIG. 1A.

Elements described herein may include multiple instances of the same element. These elements may be generically indicated by reference numerals (e.g., 110). For ease of following the description, for the most part, reference numerals begin with the number of the drawing on which the elements are introduced or most fully discussed. Thus, for example, reference numerals introduced on a FIG. 1 will be mostly in the numerical format 1xx and elements introduced on a FIG. 4 will be mostly in the numerical format 4xx. In addition, like reference numerals may be used to denote like features throughout the specification and figures.

Embodiments of the present disclosure include systems, methods and devices for providing a body connection to a vertical access device. It should be noted that while the utility and application of the various embodiments of the present disclosure are described with reference to memory arrays, the present disclosure also finds application to any other apparatus (e.g., integrated circuit, memory devices, systems, etc.) where a vertical access device may be desirable.

In particular, embodiments of the present disclosure include a vertical access device that comprises a digit line extending along a substrate to a digit line contact pillar, a body connection line extending along the substrate to a body connection line contact pillar, a body region disposed on the body connection line, an electrode disposed on the body region, and a word line forming a gate to the body region, the word line separated from the body region by a dielectric. Such a vertical access device may be a vertical memory cell of a memory cell array.

In additional embodiments, an apparatus may comprise a plurality of vertically configured access transistors arranged in a plurality of rows and columns, a plurality of word lines and a plurality of digit lines. Each word line of the plurality of word lines may form a gate for a corresponding column of vertically configured access transistors, and each digit line of the plurality of digit lines may couple to a corresponding row of vertically configured access transistors. The apparatus may further comprise a plurality of body connection lines, wherein each body connection line of the plurality of body connection lines couples to a plurality of body regions of the plurality of vertically configured access transistors.

Figure 2A:
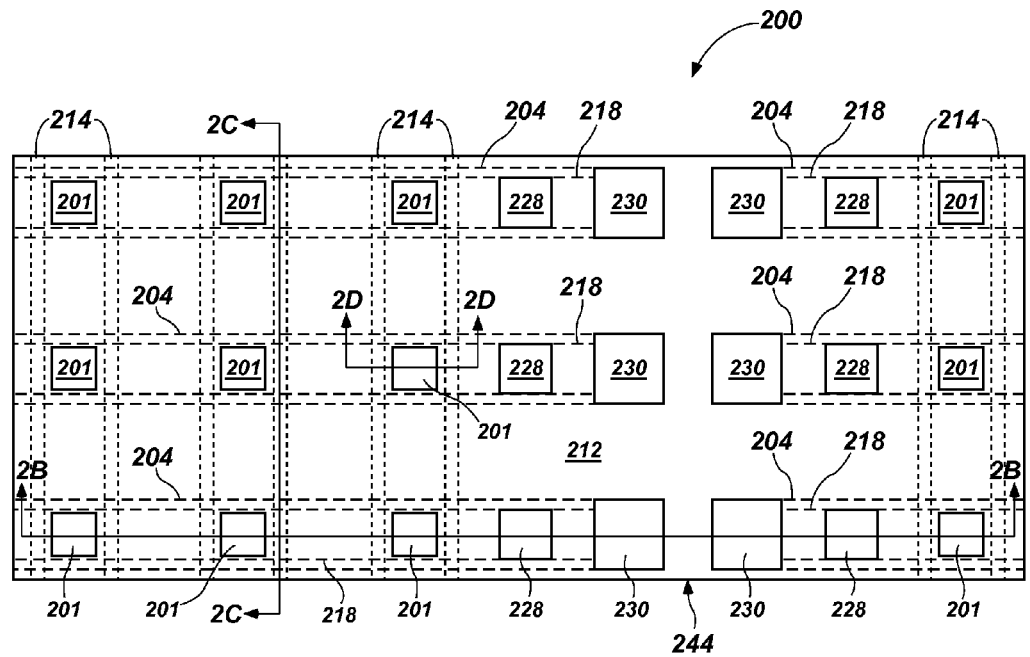
FIG. 2A is a simplified plan view of a portion of a memory cell array.

FIG. 2A is a simplified plan view of a portion of a memory cell array 200 according to an embodiment of the present disclosure. The memory cell array 200 may include a plurality of vertical memory cells 201 coupled to a plurality of access lines. Access lines may include a plurality of digit lines 204 (indicated with dashed lines), a plurality of word lines 214 (indicated with dashed lines), and a plurality of body connection lines 218 (indicated with dashed lines). The memory cell array 200 may be arranged in rows (vertical memory cells 201 coupled to a common digit line 204) and columns (vertical memory cells 201 coupled to a common word line 214). Individual vertical memory cells 201 may be located at a cross-point of a digit line 204 and a word line 214. The columns and rows may not necessarily physically resemble columns and rows, but are more of an indication of the logical organization for selecting vertical memory cells 201 within the memory cell array 200. The digit lines 204 and word lines 214, however, may extend in directions that are orthogonal to each other, such that the physical configuration of the vertical memory cells 201 may appear as rows and columns.

The digit lines 204 may extend along the substrate 202 (FIG. 2B) to a digit line contact pillar 230, the body connection lines 218 may extend along the substrate 202 to a body connection line contact pillar 228. Each of the plurality of body connection lines 218 may run parallel with a corresponding digit line 204. Although FIG. 2A shows each body connection line 218 as having a narrower width than a width of the corresponding digit line 204, such as is shown for convenience in distinguishing between the body connection line 218 and the digit line 204 for the plan view shown. Embodiments of the present disclosure, however, may include body connection lines 218 and digit lines 204 that have widths that are at least substantially equal. Of course, some embodiments may include body connection lines 218 and digit lines 204 that have widths that are different.

The memory cell array 200 may also include the plurality of digit line contact pillars 230 and the plurality of body connection line contact pillars 228. The digit line contact pillars 230 electrically couple with the corresponding digit lines 204 for applying a voltage thereto. The body connection line contact pillars 228 electrically couple with the corresponding body connection lines 218 for applying a voltage thereto.

A dielectric material 212 may also be disposed around the vertical memory cells 201, the body connection line contact pillars 228, and the digit line contact pillars 230. By way of non-limiting example, the dielectric material 212 may comprise silicon dioxide, silicon nitride, high-k dielectric material, low-k dielectric material, and combinations thereof.

The memory cell array 200 may further include one or more isolation regions 244 comprising the dielectric material 212. The one or more isolation regions 244 may be configured to electrically isolate one or more of the plurality of digit lines 204 and one or more of the plurality of body connection lines 218 from another of the plurality of digit lines 204 and another of the plurality of body connection lines 218. For example, the isolation region 244 may electrically isolate the digit line contact pillars 230 from another set of digit line contact pillars 230 that are disposed at a beginning of another set of digit lines 204 in the same corresponding rows of the memory cell array 200. Following the other set of digit line contact pillars 230, another set of body connection line contact pillars 228 may be disposed at a beginning of another set of body connection lines 218 of the memory cell array 200. In some embodiments, the plurality of body connection line contact pillars 228 and the plurality of digit line contact pillars 230 may be located only at ends of each row of the memory cell array 200.

Figure 2B:
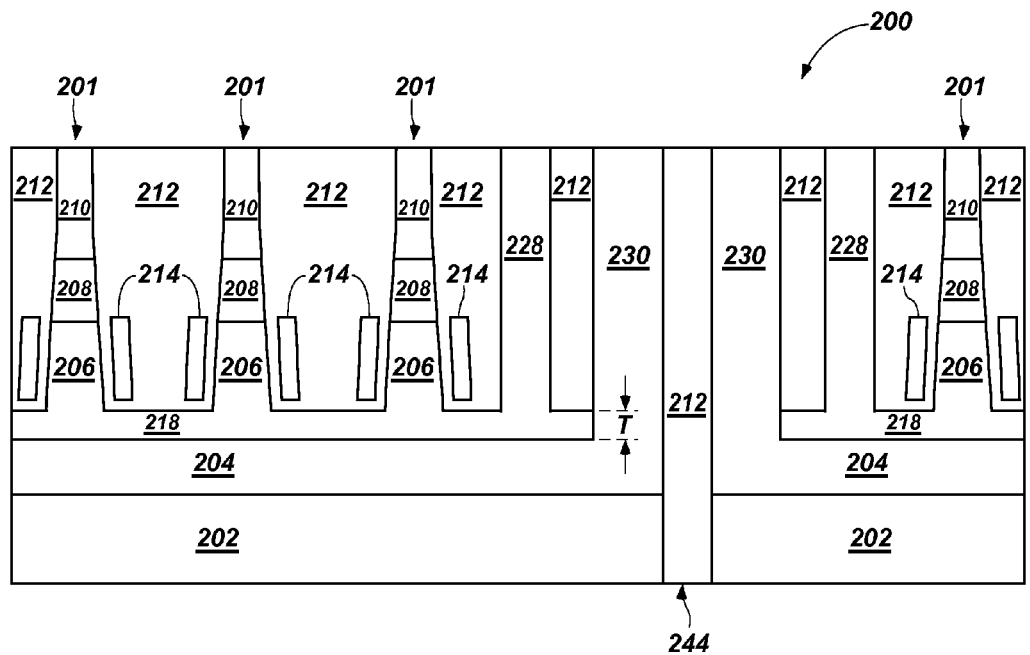
FIG. 2B is a simplified cross-sectional view of the memory cell array of FIG. 2A taken along line 2B of FIG. 2A.

FIG. 2B is a simplified cross-sectional view of the portion of the memory cell array 200 taken along line 2B of FIG. 2A. In particular, the cross-section of FIG. 2B is taken along the digit line 204 of the memory cell array 200. For clarity, it is noted that the word line 214 extends in a direction orthogonal to the cross-section of FIG. 2B.

The memory cell array 200 may include the plurality of vertical memory cells 201 disposed on a substrate 202. Each of the plurality of vertical memory cells 201 may include a body region 206, an electrode 208, and a storage element 210 stacked in a vertical arrangement. In other words, the storage element 210 may be disposed on the electrode 208, which may be disposed on the body region 206. The body region 206 may be coupled to the digit line 204. As a result, the digit line 204, the body region 206, and the electrode 208 may form a vertical access transistor for the storage element 210, with the word line 214 acting as a gate. Thus, the electrode 208 may comprise a first source/drain region and the digit line 204 may comprise a second source/drain region forming the vertical access transistor for the storage element 210. The term "source/drain region" is used to indicate that such a region may function as either a source region or a drain region for a vertical access transistor depending on an operational state of the vertical access transistor. Thus, the first source/drain region may be function as a source while the second source/drain region functions as a drain, and vice versa. Thus, the first source/drain region may function as a either a source region or a drain region to the vertical access transistor depending on the operation of the vertical access transistor. Likewise, the second source/drain region may function as either a source region or a drain region to the vertical access transistor depending on the operation of the vertical access transistor.

The digit line 204, the body region 206, and the electrode 208 may each comprise a doped semiconductor material to form a vertical access transistor for the storage element 210. For example, the digit line 204 may comprise n-type semiconductor material, the body region 206 may comprise p-type semiconductor material, and the electrode 208 may comprise n-type semiconductor material to form a vertical npn transistor that is activated by the word line 214 acting as the gate. Similarly, in some embodiments, the digit line 204 may comprise p-type semiconductor material, the body region 206 may comprise n-type semiconductor material, and the electrode 208 may comprise p-type semiconductor material to form a vertical pnp transistor that is activated by the word line 214 acting as the gate. In some embodiments, the second source/drain region and the digit line 204 may be a single integrally formed region, while other embodiments may include discrete regions for the second source/drain region and the digit line 204. For simplicity, the term "digit line" is intended to cover each embodiment unless specifically described otherwise. Similarly, "word line" is intended to cover embodiments of a single metal electrode acting as a word line and a gate, or a separate word line electrically coupled to a discrete gate formed at each vertical memory cell 201.

Each body region 206 may be disposed on a body connection line 218 of the plurality of body connection lines 218. The body region 206 may be integrally formed with the body connection line 218 such that a single integral structure may be present. In some embodiments, the body region 206 and the body connection line 218 may be formed by separate fabrication operations such that discrete features may be formed. As a result, the body region 206 being "disposed" on the body connection line 218 includes both embodiments of a single integral feature and separate features unless specifically described otherwise.

Each body connection line 218 may extend in parallel with a corresponding digit line 204 along the memory cell array 200. In other words, each of the plurality of body connection lines 218 may extend at least substantially continuously along the length of the corresponding digit line 204. In some embodiments, the individual body connection lines 218 may be at least substantially coextensive with its corresponding digit line 204, recognizing that the corresponding digit lines 204 may extend at least somewhat beyond the body connection line contact pillars 228 to accommodate placement of the body connection line contact pillars 228 and the digit line contact pillars 230. In other words, each corresponding digit line 204 may extend past the end of each body connection line 218 where a digit line contact pillar 230 may be disposed. Extension of the corresponding digit lines 204 past the ends of the body connection lines 218 to the digit line contact pillars 230 may enable contact of the digit lines 204 and the digit line contact pillars 230 without interrupting the body connection lines 218 between the vertical memory cells 201 and the body connection line contact pillars 228. In some embodiments, there may be a different number of body connection line contact pillars 228 and digit line contact pillars 230. For example, there may be a plurality of body connection line contact pillars 228 at intermediate locations along the body connection line 218 for a group of vertical memory cells 201, whereas the digit line contact pillars 230 may be located on one or more of the ends of the group of vertical memory cells 201.

Each of the plurality of body connection lines 218 may have a thickness (T) in a vertical direction. The thickness (T) of the plurality of body connection lines 218 may affect the series resistance (and, therefore, the conductivity) of the plurality of body connection lines 218 in a direction parallel to the plurality of body connection lines 218. Additionally, the thickness (T) may affect the mechanical properties of the plurality of body connection lines 218. The thickness of the word lines 214 and the digit lines 204 may likewise affect electrical and mechanical properties of the respective word lines 214 and digit lines 204.

The body region 206 may comprise doped semiconductor material of the same carrier type as the body connection line 218. In some embodiments, the doping concentration of the body connection line 218 and the body region 206 may differ. By way of non-limiting example, the doped semiconductor material of the body connection line 218 may be more heavily doped than the semiconductor material of the body region 206. In addition, the body connection line contact pillars 228 may comprise a doped semiconductor material of the same carrier type as the plurality of body connection lines 218. Also by way of non-limiting example, if the body connection line 218 comprises p-type semiconductor material, the body region 206 and the body connection line contact pillars 228 may also comprise p-type semiconductor material. Similarly, if the body connection line 218 comprises n-type semiconductor material, the body region 206 and the body connection line contact pillars 228 may also comprise n-type semiconductor material.

The electrode 208 may comprise doped semiconductor material of the same carrier type as the digit line 204 and the digit line contact pillars 230. By way of non-limiting example, if the digit line 204 comprises n-type semiconductor material, the electrode 208, and the digit line contact pillars 230 may also comprise n-type semiconductor material. Similarly, if the digit line 204 comprises p-type semiconductor material, the electrode 208, and the digit line contact pillars 230 may also comprise p-type semiconductor material. In some embodiments, the digit line 204 and/or the digit line contact pillars 230 may optionally include a conductive material (not shown), such as, for example, a metal or polysilicon, disposed underneath or on one or more sides of the doped semiconductor material. Such a conductive material may reduce resistivity and increase current flow through the digit lines 204.

Each of the plurality of body connection lines 218 may comprise semiconductor material doped with carriers opposite to the carriers of the plurality of digit lines 204. By way of non-limiting example, each of the plurality of body connection lines 218 may comprise p-type semiconductor material, and each of the plurality of digit lines 204 may comprise n-type semiconductor material. Similarly, each of the plurality of body connection lines 218 may comprise n-type semiconductor material, and each of the plurality of digit lines 204 may comprise p-type semiconductor material.

The word lines 214 may comprise a conductive material. By way of non-limiting example, the word lines 214 may comprise at least one material from the group consisting of polysilicon, a metal, and a highly doped monocrystalline semiconductor material. Each of the plurality of word lines 214 may extend proximate to one or more of the plurality of body regions 206. Although FIGS. 2A and 2B illustrate each word line 214 as a pair of conductors proximate to opposite sides of the body regions 206, the present disclosure is not so limited. In some embodiments, each word line 214 may include a single conductor proximate to a single side of the body regions 206, or any number of conductors on any number of sides of the body regions 206. For embodiments that include a pair of conductors for a single word line 214, the pair of conductors may be coupled together by a word line contact (not shown) at the end of the memory cell array 200, at intermediate locations of the memory cell array 200, or combinations thereof. Additionally, each word line 214 may at least substantially surround the body regions 206, as will be discussed below in more detail with respect to FIG. 5.

The substrate 202 may comprise a semiconductor material. By way of non-limiting example, the semiconductor material may include any of silicon, germanium, III-V semiconductor material, and combinations thereof. In some embodiments, the substrate may comprise a semiconductor-on-insulator substrate, such as, by way of non-limiting example, a silicon-on-insulator (SOI) substrate, or a silicon-on-sapphire (SOS) substrate.

The storage element 210 may include any device configured to store digital information. By way of non-limiting example, the storage element 210 may include any of a capacitor, a phase change material, a material comprising ionic or thermal resistive switching properties, a magnetoresistive element, a resistive element, a ferroelectric material, a multiferroic material, or other similar materials.

Figure 2C:
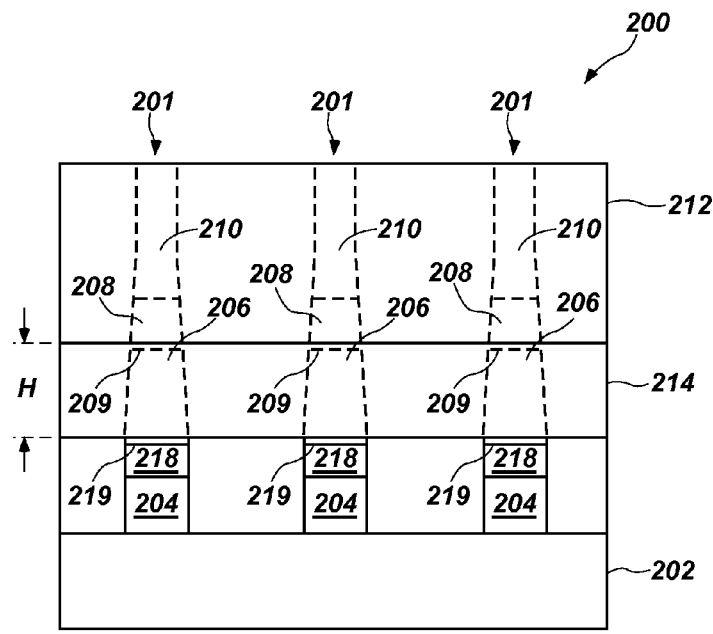
FIG. 2C is a simplified cross-sectional view of the memory cell array of FIG. 2A taken along line 2C of FIG. 2A.

FIG. 2C is a simplified cross-sectional view of the memory cell array 200 taken along the line 2C of FIG. 2A. In particular, the cross-section of FIG. 2C is taken along the word line 214 of the memory cell array 200. FIG. 2C illustrates the substrate 202, the plurality of digit lines 204, the plurality of body connection lines 218, the word line 214, and the vertical memory cells 201 (shown with dashed lines to indicate presence behind the cross-section). For clarity, it is noted that the body connection lines 218 and digit lines 204 extend in a direction orthogonal to the cross-section of FIG. 2C.

The word line 214 may extend proximate to the body regions 206 between the electrodes 208 and the body connection lines 218. The height (H) of the word line 214 may be approximately the same as the body region 206. In some embodiments, a top of the word line 214 may align approximately with a top of the body region 206, and a bottom of the word line 214 may align approximately with a bottom of the body region 206. The top of the body region 206 may be an interface 209 between the body region 206 and the electrode 208, while the bottom of the body region 206 may be an interface 219 between the body region 206 and the body connection line 218. In some embodiments (as shown in FIG. 2C), the height (H) of the word line 214 may be approximately uniform as the word line 214 extends across the memory cell array 200.

Figure 2D:
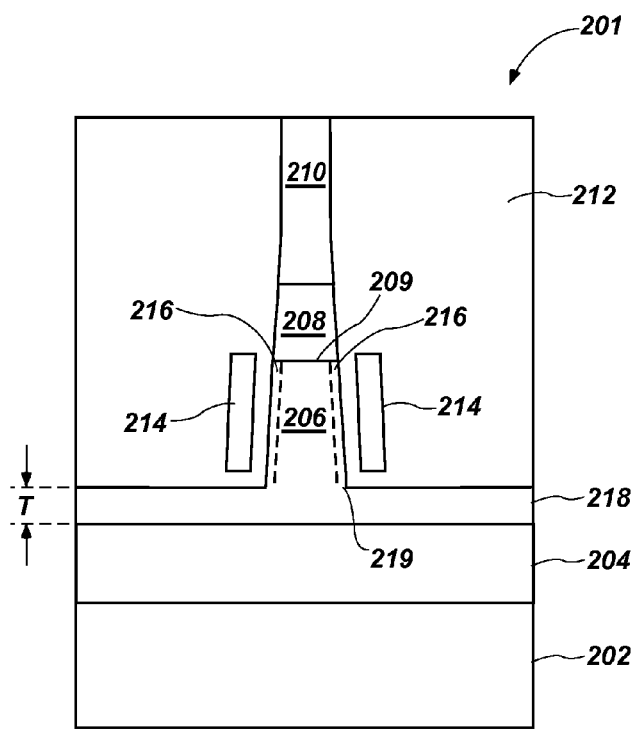
FIG. 2D is a simplified cross-sectional view of a vertical memory cell of the memory cell array of FIG. 2A taken along line 2D of FIG. 2A.

FIG. 2D is a simplified cross-sectional view of a vertical memory cell 201 of the memory cell array 200 taken along the line 2D of FIG. 2A. In particular, the cross-section of FIG. 2D is taken along the digit line 204 of the memory cell array 200. For clarity, it is noted that the word line 214 extends in a direction orthogonal to the cross-section of FIG. 2D.

As discussed above, the height (H) of the word line 214 may be approximately the same as the body region 206. Although the word line 214 was described above as extending approximately from the top of the body region 206 to approximately the bottom of the body region 206, this description was not intended to be an exact description. For example, as shown in FIG. 2D, the bottom of the word line 214 may not extend completely to the bottom of the body region 206 so as to maintain at least some separation of the word line 214 and the body connection line 218 with the dielectric material 212.

In operation, a combination of voltages may be applied to the word lines 214 and the digit lines 204 to access a particular vertical memory cell 201 of the memory cell array 200. A first voltage may be applied to the body connection line 218 through the body connection line contact pillar 228, a second voltage may be applied to a word line 214 through a word line contact (not shown), and a third voltage may be applied to the digit line 204 through the digit line contact pillar 230. The first voltage may be selected to bias a subgroup of the plurality of body regions 206 that are disposed on the one or more of the plurality of body connection lines 218 to a desired voltage. As a result, charge build-up within the plurality of body regions 206 may be encouraged or discouraged, according to the desired operation, providing control over leakage currents and threshold voltages.

In some embodiments, each of the body connection lines 218 may have the same first voltage applied thereto. For example, in some embodiments all body connection lines 218 may be coupled together with each body connection line contact pillar 228 being coupled to a common contact. In some embodiments, the plurality of body connection lines 218 may be grouped in a plurality of subgroups, wherein each subgroup has a connection that is configured to receive a voltage independent of a voltage applied to a different subgroup. In other words, different subgroups of body connection lines 218 may independently have different first voltages applied thereto. For example, subgroups of body connection lines 218 may be formed by coupling together a subgroup of body connection line contact pillars 228. Thus, a first subgroup of body connection lines 218 may receive a voltage as its first voltage, while a second subgroup of body connection lines 218 may receive a different voltage as its first voltage. Of course, any number of subgroups are contemplated, as is the number of body connection lines 218 and body connection line contact pillars 228 that may be part of the same subgroup. As used herein, a subgroup of body connection lines 218 may include one or more body connection lines 218. For example, in some embodiments, one or more individual body connection lines 218 may have an independent connection through its respective body connection line contact pillar 228. Thus, each connection (whether for individual body connection lines 218 or a subgroup) may have independent connections that may receive different body voltages as desired. By way of non-limiting example, a first subgroup of body connection lines 218 connected to the body regions 206 of primarily operationally inactive vertical memory cells 201 may have a first voltage selected for reducing operational power applied thereto. As a result, an active sub-array and an inactive sub-array of the memory cell array 200 may receive different body voltages, which may result in a reduced power dissipation than if all active and inactive sub-arrays receive the same body voltage. Also by way of non-limiting example, a second subgroup of body connection lines 218 connected to the body regions 206 of operationally active vertical memory cells 201 may have a first voltage selected for reducing floating body effects of the active vertical memory cells 201 connected thereto.

In operation, an appropriate second voltage may be applied to the word line 214 to access a particular vertical memory cell 201. The second voltage may be selected to cause a first conductive channel 216 (shown in dashed lines to indicate intermittent presence) to form through the body region 206. By way of non-limiting example, if the digit line 204 and the electrode 208 comprise n-type semiconductor material, and the body region 206 and the body connection line 218 comprise p-type semiconductor material, the second voltage may be a high voltage that is sufficient to attract electrons in the body region 206, causing the first conductive channel 216 to form through the body region 206 along an outer periphery of the body region 206. The first conductive channel 216 may be formed through the body region 206, and the storage element 210 may be accessed through the digit line 204. Accessing the storage element 210 with the digit line 204 may enable read or write operations to the storage element 210 by applying the appropriate third voltage to the digit line 204 through the digit line contact pillar 230 (FIG. 2A).

As discussed above, the body connection line 218 may receive an appropriate first voltage through the body connection line contact pillar 228 to provide a path for charges to travel into and out of the body regions 206 of the vertical memory cells 201, which may reduce at least some of the adverse effects of a floating body that exists in a conventional vertical memory cell. For example, if sufficient conductivity is established between the body connection line contact pillars 228 and the body regions 206, and an appropriate first voltage is applied to the body connection line contact pillars 228, the floating body effects may be reduced or eliminated. For example, leakage current from the body regions 206 may be reduced, and power dissipation in the memory cell array 200 may be more consistent and controlled.

The more conductive each of the plurality of body connection lines 218 is between the body regions 206 and the body connection line contact pillars 228, the more the floating body effects may be controlled or eliminated. The conductivity of the plurality of body connection lines 218 between the body regions 206 and the body connection line contact pillars 228 is proportional to the thickness (T) of the plurality of body connection lines 218. Consequently, it may be desirable for the thickness (T) of the plurality of body connection lines 218 to be relatively large. In some embodiments, the thickness (T) may be at least about 25 nanometers thick.

Although an increased thickness (T) of the plurality of body connection lines 218 may be desirable to increase the conductivity of the body connection line 218, the conductivity between the digit line 204 and the body region 206 is inversely proportional to the thickness (T) of the plurality of body connection lines 218. An increased thickness (T) of the plurality of body connection lines 218, consequently, may decrease the conductivity between the digit lines 204 and the body regions 206.

A decreased conductivity between the digit lines 204 and the body regions 206 may cause an increased voltage drop between the digit lines 204 and the body regions 206, which may cut into already narrow threshold voltage ranges in low-voltage systems. Additionally, decreased conductivity between the digit lines 204 and the body regions 206 may decrease drive current, resulting in slower operational speed. To mitigate the decreased conductivity between the digit lines 204 and the body regions 206, the word lines 214 may optionally be configured to extend toward the substrate 202, proximate to the body connection lines 218.

Figure 3A:
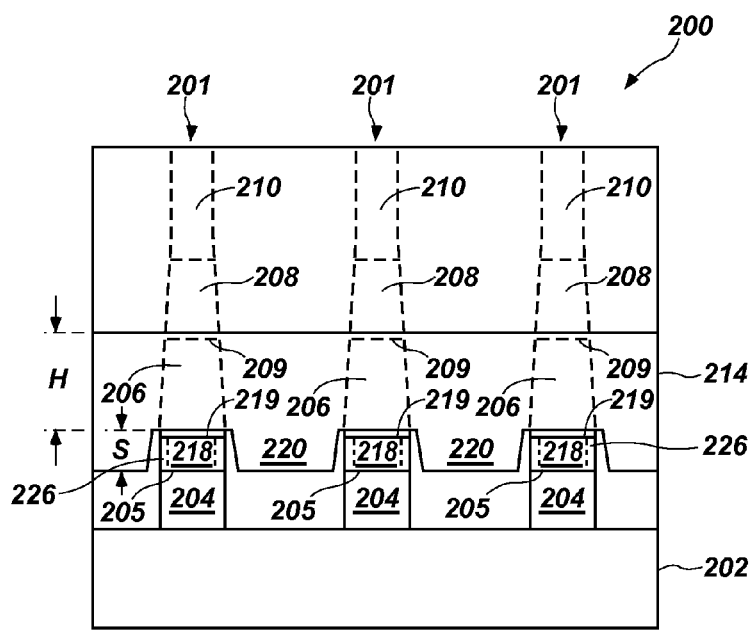
FIG. 3A is a simplified cross-sectional view of a memory cell array.

FIG. 3A is a simplified cross-sectional view of a memory cell array 200 according to another embodiment of the present disclosure. The cross-section of FIG. 3A is similar to FIG. 2C, being taken along the word line 214 of the memory cell array 200. In addition, the memory cell array 200 of FIG. 3A is similar to FIG. 2C as to the general structure of the memory cell array 200. The difference, however, between FIG. 3A and FIG. 2C is in the structure of the word line 214. For clarity, it is noted that the body connection lines 218 and digit lines 204 extend in a direction orthogonal to the cross-section of FIG. 3A.

As discussed above, the word line 214 of FIG. 2C may be substantially uniform as the word line 214 extends across the memory cell array 200. The word line 214 of FIG. 3A, however, may not be substantially uniform as the word line 214 extends across the memory cell array 200. For example, at least a portion 220 of the word line 214 may further extend toward the substrate 202 in the region between neighboring body connection lines 218. This portion 220 of the word line 214 may be referred to as a "saddle region" 220, as the word line 214 may "saddle" (e.g., overlap) the body connection lines 218 by at least partially surrounding the sides of the body connection lines 218. The word line 214, therefore, has a first portion that has a height (H), while the saddle region 220 has a height (S) that further extends toward the substrate 202.

The saddle region 220 may extend at least beyond a top surface of the body connection line 218 in the region between the neighboring body connection lines 218. In other words, the saddle region 220 of the word line 214 may extend below the interface 219 in the region between the neighboring body connection lines 218. By way of non-limiting example, the saddle region 220 may extend to a bottom of the body connection line 218. The bottom of the body connection line 218 may be an interface 205 between the body connection line 218 and the digit line 204. The present disclosure, however, is not so limited. In some embodiments, the saddle region 220 may extend toward the substrate 202 beyond the bottom of the body connection lines 218. In other embodiments, the saddle region 220 may extend toward the substrate 202 with a height (S) such that the saddle region 220 does not extend as far as the bottom of the body connection lines 218.

The saddle region 220 may be formed by over-etching the dielectric material 212 in the word line 214 trench. The shape of the saddle region 220 may vary. By way of non-limiting example, FIG. 3A illustrates the saddle region 220 shaped as a trapezoidal extension of the word line 214 toward the substrate 202 in the region between neighboring body connection lines 218. Other shapes are also contemplated. For example, the saddle region 220 may have square, rectangular, or other similar shapes having sides with distinct angles. Other shapes of the saddle region 220 may include those having curved sides, such as a half-circle, a parabola, a shape having curved sides with a flat bottom, or other suitable shapes including arcuate peripheral boundaries. In general, the saddle region 220 may be shaped in any configuration that may enable the word line 214 to function as a gate to at least a portion of the body connection line 218.

In operation, if the second voltage is applied to the word line 214, a portion of the body connection line 218 proximate to the word line 214 may be inverted, forming a second conductive channel 226 through the body connection line 218. If the second voltage is removed from the word line 214, the section of the body connection line 218 proximate to the word line 214 may be accumulated, causing the second conductive channel 226 to cut off.

The second conductive channel 226 may increase the conductivity between the digit lines 204 and the body regions 206, which may mitigate at least some of the adverse effects of increasing the thickness (T) of the body connection lines 218. Consequently, a relatively large thickness (T) of the body connection lines 218 may provide a high conductivity between the body regions 206 and the body connection line contact pillars 228 without sacrificing conductivity between the digit lines 204 and the body regions 206. Furthermore, the thickness (T) of the body connection lines 218 may be sufficiently large to avoid damage to the body connection lines 218 due to becoming pinched during word line separation etch, which may etch away part of the body connection lines 218.

Figure 3B:
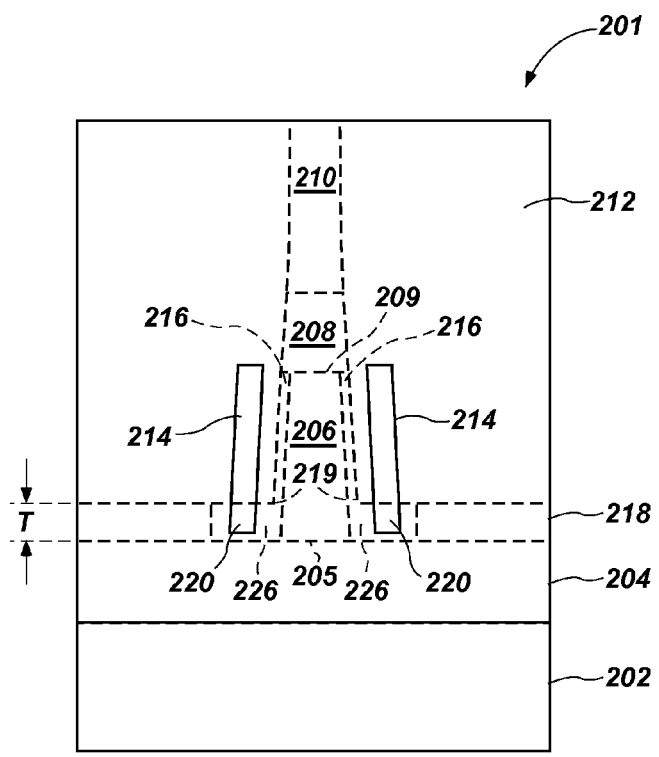
FIG. 3B is a simplified cross-sectional view of a memory cell array.

FIG. 3B is a simplified cross-sectional view of a vertical memory cell 201 of a memory cell array 200 according to another embodiment of the present disclosure. The cross-section of FIG. 3B is similar to FIG. 2D, being taken along the digit line 204 of the memory cell array 200. In addition, the memory cell array 200 of FIG. 3B is similar to FIG. 2D as to the general structure of the vertical memory cell 201 of the memory cell array 200. The difference, however, between FIG. 3B and FIG. 2D is in the structure of the word line 214. In particular, the structure of the word line 214 in FIG. 3B corresponds to the structure described with respect to FIG. 3A. In other words, the cross-sectional view in FIG. 3B is a different view of the vertical memory cell 201 of FIG. 3A. Each of the digit line 204, the body connection line 218, the body region 206, the electrode 208, and the storage element 210 is shown in dashed lines to indicate presence behind the cross-section. Thus, the cross-section shown in FIG. 3B is taken at some location between neighboring body connection lines 218 of the memory cell array 200, where the saddle region 220 exists. For clarity, it is noted that the word line 214 extends in the direction orthogonal to the cross-section of FIG. 3B.

As shown in FIG. 3B, the saddle region 220 extends below the interface 219 toward the substrate 202. As discussed above with respect to FIG. 3A, the saddle region 220 may extend to a bottom of the body connection line 218, beyond the bottom of the body connection line 218, or to a distance that does not extend as far as the bottom of the body connection lines 218. As is apparent from FIG. 3A, the saddle region 220 is offset from the body connection lines 218 and the digit lines 204 such that the saddle region 220 will be separated from each by the dielectric material 212.

In operation, the saddle region 220 may cause the second conductive channel 226 to form through the body connection line 218, which may increase the conductivity between the digit lines 204 and the body regions 206 as discussed above with respect to FIG. 3A.

Figure 4:
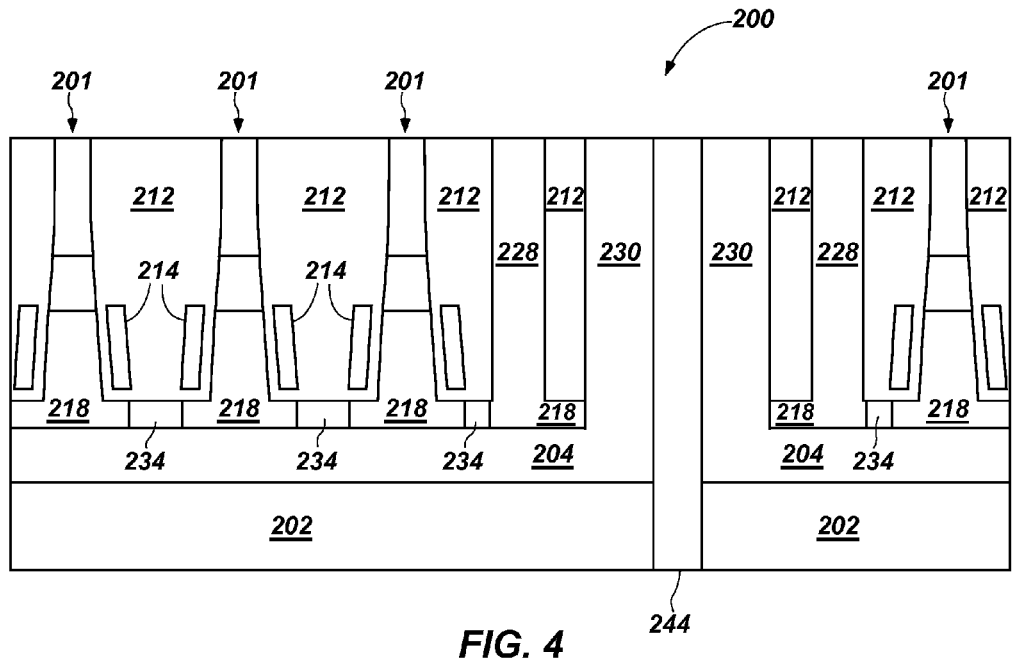
FIG. 4 is a simplified cross-sectional view of a memory cell array.

FIG. 4 is a simplified cross-sectional view of a memory cell array 200 according to another embodiment of the present disclosure. The cross-section of FIG. 4 is similar to FIG. 2B being taken along the digit line 204 of the memory cell array 200. For clarity, it is noted that the word line 214 extends in a direction orthogonal to the cross-section of FIG. 4.

In addition, the memory cell array 200 of FIG. 4 is similar to FIG. 2B as to the general structure of the memory cell array 200. The difference, however, between FIG. 2B and FIG. 4 is in the structure of the body connection lines 218. In particular, the body connection lines 218 of FIG. 4 may further include a plurality of pocket regions 234 between the vertical memory cells 201. The pocket regions 234 may comprise a semiconductor material that is doped at a higher carrier concentration than the rest of the body connection lines 218. The inclusion of the more highly doped pocket regions 234 may cause the conductivity of the body connection lines 218 as a whole to increase by reducing the resistance of the body connection lines 218.

The pocket regions 234 may be formed in the body connection lines 218 after the vertical memory cells 201 have been formed on the body connection lines 218. For example, a self-aligned implant operation may be performed after word line separation. Impurities may be implanted to increase the doping of the body connection lines 218 in the pocket regions 234. By way of non-limiting example, if the body connection lines 218 comprise p-type silicon, impurities such as boron or gallium may be implanted in the pocket regions 234 to increase the number of charge carriers in the pocket regions 234. If the body connection lines 218 comprise n-type silicon, impurities such as, for example, phosphorus or arsenic may be implanted into the pocket regions 234 to increase the number of charge carriers in the pocket regions 234. In some embodiments, the memory cell array 200 may be heated following the implantation of impurities in the pocket regions 234. If such heating occurs, the impurities may disperse more uniformly throughout the body connection lines 218.

Figure 5:
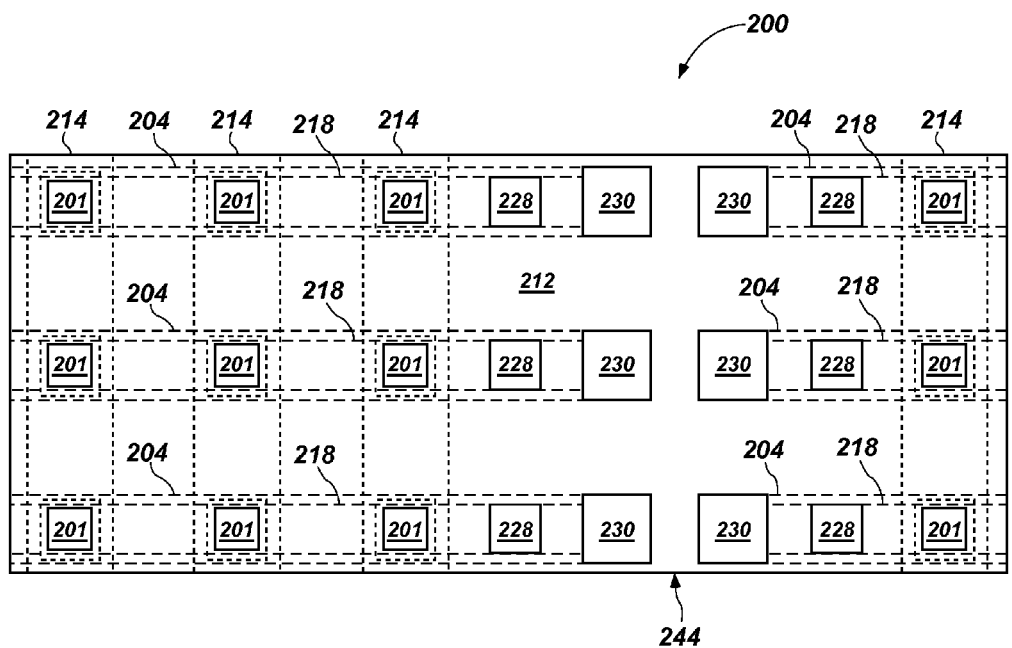
FIG. 5 is a simplified plan view of a memory cell array.

FIG. 5 is a simplified plan view of a memory cell array 200 according to another embodiment of the present disclosure. The plan view of FIG. 5 is similar to the plan view illustrated in FIG. 2A. The structure of the memory cell array 200 of FIG. 5 is similar to that of FIG. 2A. The difference between FIG. 5 and FIG. 2A is in the structure of the word lines 214. In particular, the word lines 214 of FIG. 5 are configured to at least substantially surround the body regions 206 of the vertical memory cells 201. Like the word lines 214 of FIG. 2A, the word lines 214 of FIG. 5 may include a pair of conductors proximate to opposite sides of the body regions 206. In contrast to the word lines 214 of FIG. 2A, however, the word lines 214 of FIG. 5 may additionally couple to each other at locations between the vertical memory cells 201. As a result, the word lines 214 may be positioned to surround the body regions 206 on each side. In some other embodiments, the word lines 214 may be configured to partially surround the body regions 206 on only three sides. The word lines 214 of FIG. 5, similar to the word lines 214 of FIG. 2A, may be coupled to a word line contact (not shown) at the end of the memory cell array 200, at intermediate locations along the memory cell array 200, or combinations thereof.

Figure 6:
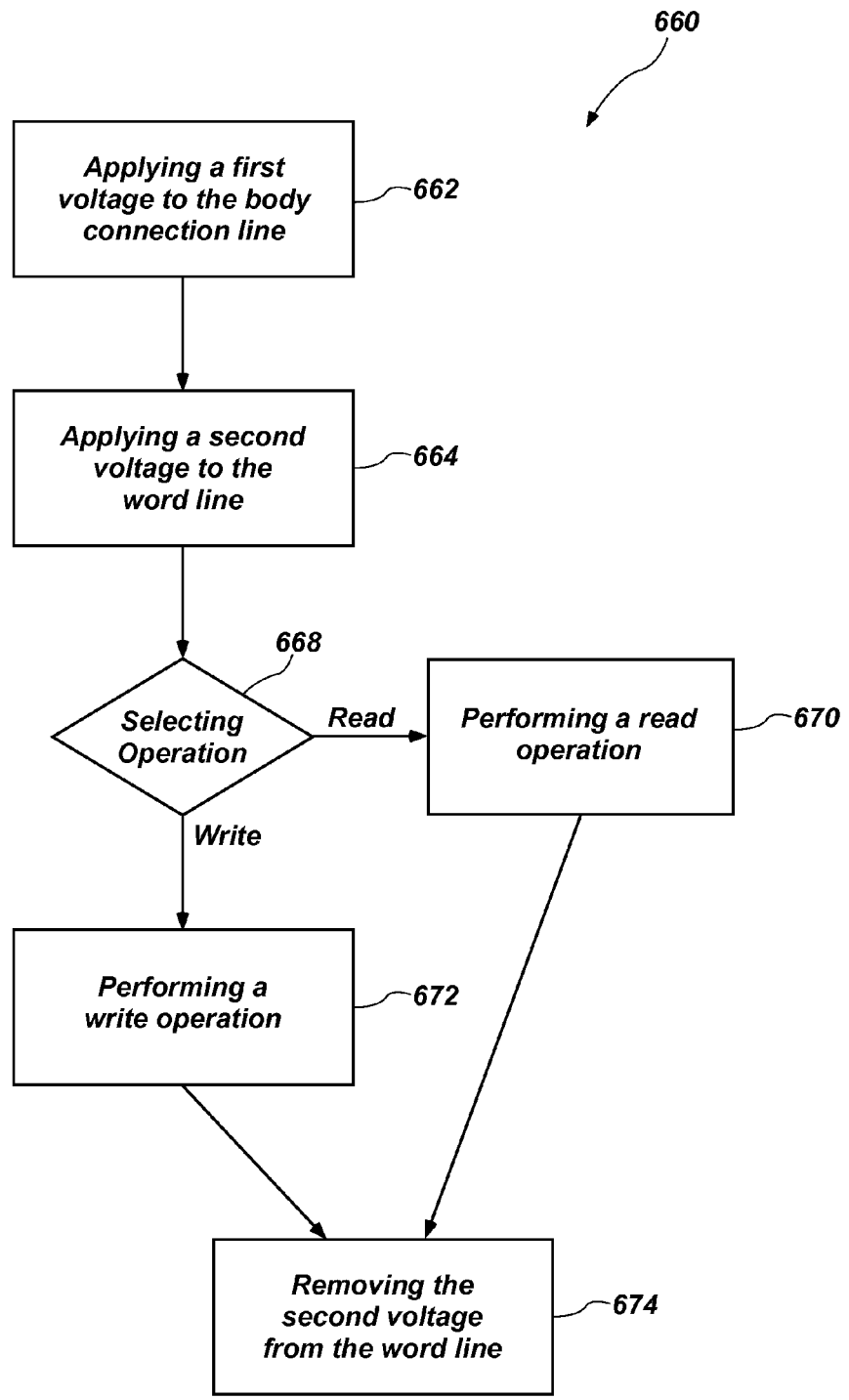
FIG. 6 is a simplified flowchart illustrating a method of operating a vertical memory cell.

FIG. 6 is a simplified flowchart 660 illustrating a method of operating a vertical memory cell (e.g., vertical memory cell 201 of any of FIGS. 2A through 2D, 3A, 3B, 4, and 5). At operation 662, a first voltage may be applied to the body connection line 218 of a vertical memory cell 201 having a body connection line 218 extending along the memory cell array 200 to a body connection line contact pillar 228. The body connection line 218 may run parallel to the digit line 204. The first voltage may be selected to bias the body regions 206 to a desired level. At operation 664, a second voltage may be applied to the word line 214. The second voltage may be selected to cause the body regions 206 to invert and form the first conductive channel 216 in each of the body regions 206 proximate the word line 214. In some embodiments that include the saddle region 220, the second voltage may further cause the second conductive channel 226 to be formed in the body connection lines 218 proximate the saddle regions 220 of the word line 214.

At operation 668, a decision may be made for selecting an operation to perform on the vertical memory cell 201. Operations that may be selected to perform on the vertical memory cell 201 may include a read operation and a write operation. If the read operation is selected, a read operation may be performed at operation 670. Performing a read operation may comprise any operation for detecting an operational state of the storage element 210, including applying an appropriate combination of voltages to the appropriate word line 214 and digit line 204 for selecting a particular vertical memory cell 201 from which to read. By way of non-limiting example, if the storage element 210 includes a capacitor, performing a read operation may include detecting a charge stored on the capacitor.

If the write operation is selected, a write operation may be performed at operation 672. Performing a write operation may include any operation for changing the operational state of the storage element 210, including applying an appropriate combination of voltages to the appropriate word line 214 and digit line 204 for selecting a particular vertical memory cell 201 to which to write. By way of non-limiting example, if the storage element 210 includes a capacitor, performing a write operation may comprise supplying a current to the storage element 210. The current may be applied to the storage element 210 by applying an appropriate third voltage to the digit line 204 that underlies the vertical memory cell 201.

At operation 674, the second voltage may be removed from the word line 214. Removing the second voltage from the word line 214 may cause the first conductive channel 216 to dissipate. Removing the second voltage from the word line 214 may also cause the second conductive channel 226 to dissipate, if such was formed by the presence of the saddle region 220.

The memory cell arrays described herein may be included within an apparatus. The memory cell array may include a substrate, a body connection line pillar disposed on the substrate, and a plurality of vertical memory cells disposed on the substrate. Each of the plurality of vertical memory cells may include a body region, and a body connection line extending across the substrate and coupling the body region to the body connection line pillar. The apparatus may comprise a memory device including the memory array. The apparatus may further include an electrical system including the memory device. The apparatus may further include a control circuit and an input device and an output device operably coupled to the control circuit.

Figure 7:
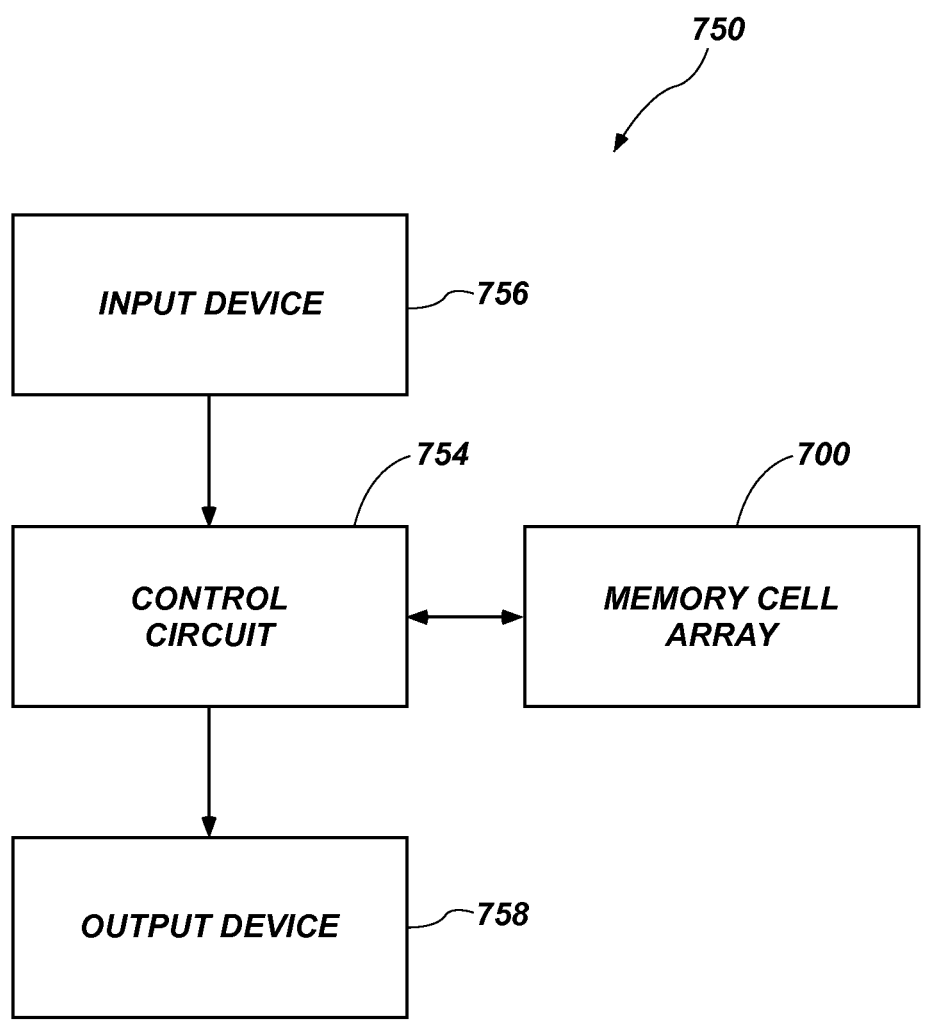
FIG. 7 is a simplified block diagram of an electrical system including a vertical memory cell.

FIG. 7 is a simplified block diagram of an electrical system 750 including a vertical memory cell. The electrical system 750 may include a memory cell array 700, a control circuit 754, an input device 756, and an output device 758 that are operably coupled to communicate with each other through the control circuit 754. The memory cell array 700 may include a plurality of vertical memory cells 201, one or more body connection lines 218, one or more digit lines 204, and one or more word lines 214, as described with reference to FIGS. 2A through 2D, 3A, 3B, 4, and 5. In general, the memory cell array 700 may include any combination of features of the memory cell arrays 200 described herein, and/or their equivalents.

The control circuit 754 may be configured to control the memory cell array 700. The control circuit 754 may include one or more devices from the group consisting of a processor, a hard disk drive, and an optical disc drive (not shown). The control circuit 754 may be operably coupled to the digit lines 204, the body connection lines 218, and the word lines 214 (FIGS. 2A through 2D, 3A, 3B, 4, and 5) of the memory cell array 700. The control circuit 754 may also be configured to apply one or more of a plurality of voltages to the digit lines 204, the body connection lines 218, and the word lines 214 of the memory cell array 700. The control circuit 754 may be further configured to perform read and write operations on the memory cell array 700.

The control circuit 754 may also be operably coupled to the input device 756, and the output device 758. By way of non-limiting example, the input device 756 may include any of a keyboard, a button array, a mouse device, a touch screen input, other similar devices, and combinations thereof. The control circuit 754 may be configured to receive and execute commands, and receive information, from the input device 756.

The output device 758 may include, by way of non-limiting example, any of a liquid crystal display (LCD) device, a light-emitting diode (LED) array, a cathode ray tube (CRT) display, a sound generating device, an electrical signal output port, other similar devices, and combinations thereof. The control circuit 754 may be configured to cause the output device 758 to communicate information to a user (not shown) or another device (not shown).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

The invention claimed is:

1. A semiconductor device, comprising:
a vertical memory cell having a body region disposed on a digit line; and
a word line forming a gate for the body region, and including a saddle region having a portion extending below the body region;
a body connection line disposed between the body region of the vertical memory cell and the digit line, wherein the portion of the saddle region extending below the body region is proximate at least one vertical side of the body connection line.

2. The semiconductor device of claim 1, wherein the body region and the body connection line comprise doped semiconductor material of a same carrier type.

3. The semiconductor device of claim 2, wherein the body region and the body connection line have doping concentrations that differ.

4. The semiconductor device of claim 3, wherein the doping concentration of the body connection line is greater than the doping concentration of the body region.

5. The semiconductor device of claim 1, wherein the body connection line and the digit line extend away from the vertical memory cell.

6. The semiconductor device of claim 5, wherein the body connection line and the digit line extend coextensively toward a body connection line contact and a digit line contact formed on a substrate.

7. The semiconductor device of claim 1, wherein the word line includes a conductive material selected from the group consisting of a polysilicon, a metal, and a doped monocrystalline semiconductor material.

8. A semiconductor device, comprising:
at least one vertical memory cell operably coupled with a digit line, a word line and a body connection line, the at least one vertical memory cell having a body region disposed on the body connection line, wherein the word line includes:
a first region configured to form a first conductive channel in the body region responsive to a voltage applied to the word line; and
a second region configured to form a second conductive channel in the body connection line responsive to the voltage applied to the word line.

9. The semiconductor device of claim 8, wherein the word line includes a pair of conductors proximate to opposite sides of the body region.

10. The semiconductor device of claim 8, wherein the word line at least partially surrounds the body region.

11. The semiconductor device of claim 8, wherein the at least one vertical memory cell includes an electrode, a storage element, and the body region stacked in a vertical arrangement, wherein the digit line, the body region, and the electrode form a vertical access transistor for the storage element.

12. The semiconductor device of claim 11, wherein the digit line comprises an n-type semiconductor material, the body region comprises a p-type semiconductor material, and the electrode comprises an n-type semiconductor material.

13. The semiconductor device of claim 11, wherein the vertical access transistor is a vertical pnp transistor.

14. The semiconductor device of claim 11, wherein the storage element is selected from the group consisting of a capacitor, a phase change material, a material exhibiting ionic or thermal resistive switching properties, a magnetoresistive element, a resistive element, a ferroelectric material, and a multiferroic material.

15. The semiconductor device of claim 8, wherein a height of the first region of the word line is approximately the same as a height of the body region.

16. The semiconductor device of claim 8, wherein the second region has a shape selected from the group consisting of a trapezoid, square, rectangle, half-circle, a parabola, and a shape having curved sides and a flat bottom.

17. The semiconductor device of claim 8, wherein a portion of the body connection line includes a semiconductor material that is doped at a higher carrier concentration relative to another portion of the body connection line.

18. The semiconductor device of claim 8, further comprising an array of vertical memory cells.

19. The semiconductor device of claim 18, wherein the vertical memory cells of the array have body regions and body connection lines, wherein at least some of the body connection lines are coupled together with a common contact.

20. A method of forming a semiconductor device having at least one vertical memory cell, the method comprising:

disposing a body region on a body connection line disposed on a digit line;

disposing a word line having a saddle region including a first portion proximate the body region and at least a second portion extending below the body region and proximate at least one vertical side of the body connection line.

21. The method of claim 20, further comprising:

disposing an electrode on an end of the body region opposite the digit line; and disposing a storage element on an end of the electrode opposite the body region.

22. The method of claim 20, wherein disposing the body region on the body connection line includes forming the body region and the body connection line as a single integral structure.

* * * * *